US008361829B1

(12) United States Patent
Gordon et al.

(10) Patent No.: US 8,361,829 B1
(45) Date of Patent: Jan. 29, 2013

(54) ON-CHIP RADIATION DOSIMETER

(75) Inventors: Michael S. Gordon, Yorktown Heights, NY (US); Kenneth P. Rodbell, Sandy Hook, CT (US); Jeng-Bang Yau, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/222,790

(22) Filed: Aug. 31, 2011

(51) Int. Cl.
*H01L 23/552* (2006.01)
*H01L 27/14* (2006.01)
*H01L 31/08* (2006.01)
*G01T 1/24* (2006.01)

(52) U.S. Cl. ..... 438/57; 438/948; 257/428; 250/370.01; 250/370.07

(58) Field of Classification Search ............. 250/370.01, 250/370.07
See application file for complete search history.

(56) References Cited

U.S. PATENT DOCUMENTS

| 5,103,277 | A | 4/1992 | Caviglia et al. |
|---|---|---|---|
| 5,117,113 | A | 5/1992 | Thomson et al. |
| 5,164,805 | A | 11/1992 | Lee |
| 5,245,191 | A | 9/1993 | Barber et al. |
| 5,589,708 | A | 12/1996 | Kalnitsky |
| 6,043,536 | A | 3/2000 | Numata et al. |
| 6,208,535 | B1 | 3/2001 | Parks |
| 6,977,989 | B2 | 12/2005 | Bothe et al. |
| 7,858,425 | B2 | 12/2010 | Sanders et al. |
| 7,868,362 | B2 | 1/2011 | Randazzo et al. |
| 2003/0125616 | A1* | 7/2003 | Black et al. ................... 600/407 |
| 2004/0094811 | A1 | 5/2004 | Takagi |
| 2005/0040462 | A1 | 2/2005 | Koh |
| 2005/0194633 | A1 | 9/2005 | Mori |
| 2006/0231892 | A1 | 10/2006 | Furukawa et al. |
| 2007/0184611 | A1 | 8/2007 | Oh et al. |
| 2007/0190740 | A1 | 8/2007 | Furukawa et al. |
| 2007/0275690 | A1 | 11/2007 | Hunter et al. |
| 2010/0096556 | A1 | 4/2010 | Arsalan et al. |

OTHER PUBLICATIONS

Buehler, et al., "On-Chip p-Mosfet Dosimeter", IEEE Transaction on Nuclear Science, vol. 40, No. 6; Dec. 1993; pp. 1442-1449.
Calvo, et al., "Integrated CMOS Linear Dosimeters"; Argentina; Spain; pp. 1-4; 1998.
Moreno, et al., "Radiation Sensor Compatible with Standard CMOS Technology", IEEE Transaction Nuclear Science, vol. 56, No. 5; pp. 2910-2915; Oct. 2009.
Vargas, et al., "An Approach for Designing Total-Dose Tolerant MCMS Based on Current Monitoring", AT&T Bell Laboratories, et al.; Princeton, New Jersey, USA; IEEE 1995; pp. 345-354.
Shaneyfelt, et al., An Embeddable SOI Radiation Sensor, IEEE Transactions on Nuclear Science, Dec. 2009, pp. 3372-3380, vol. 56, No. 6, IEEE.

* cited by examiner

*Primary Examiner* — Bac Au
*Assistant Examiner* — Pamela E Perkins
(74) *Attorney, Agent, or Firm* — Cantor Colburn LLP; Louis Percello

(57) ABSTRACT

A method for forming a semiconductor device includes forming an implant mask on a substrate, such that a first portion of the substrate is located under the implant mask, and a second portion of the substrate is exposed; performing oxygen ion implantation of the substrate; removing the implant mask; and forming a first field effect transistor (FET) on the first portion of the substrate, and forming a second FET on the second portion of the substrate, wherein the second FET has a higher radiation sensitivity than the first FET.

13 Claims, 15 Drawing Sheets

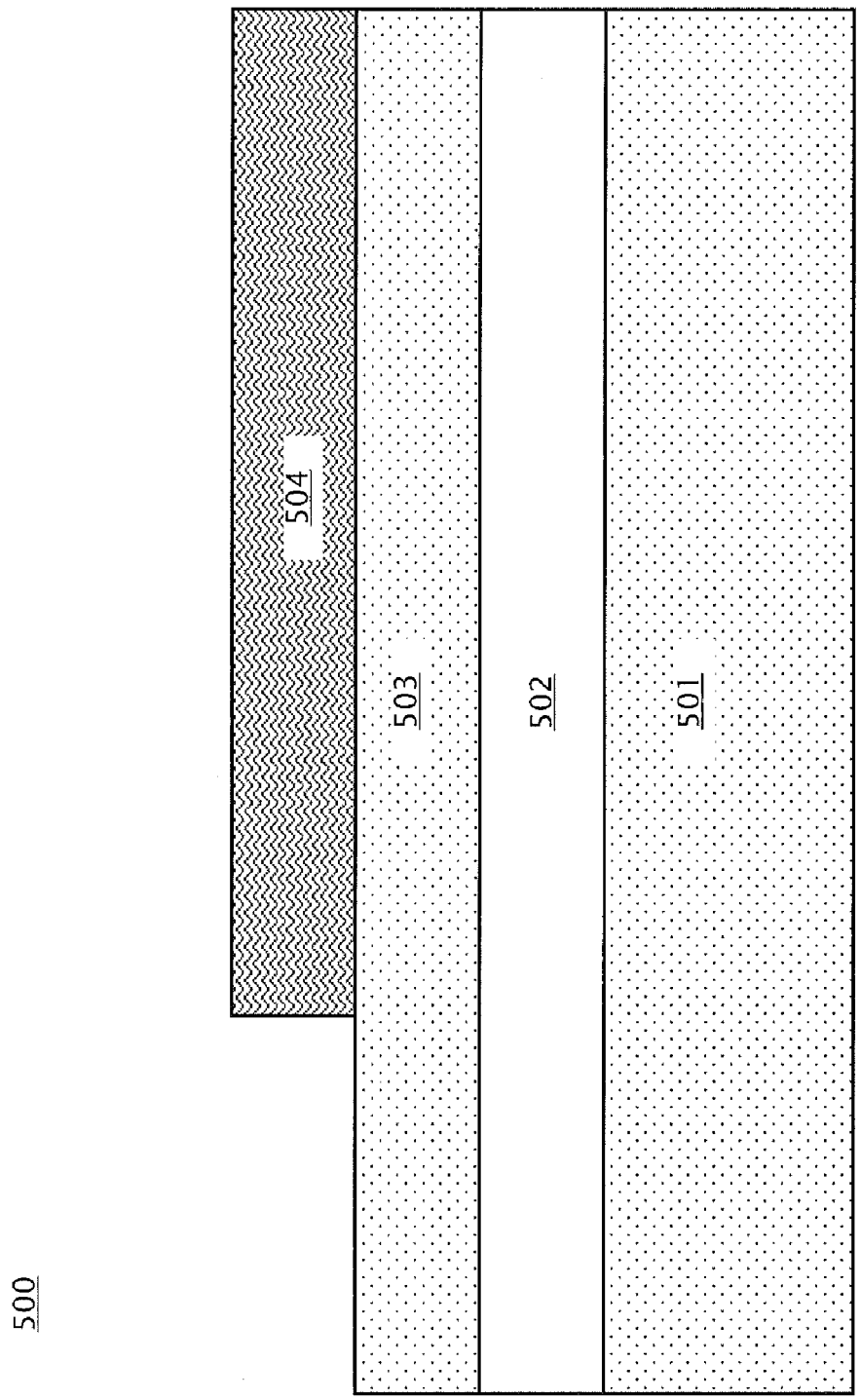

ON-CHIP RADIATION DOSIMETER

BACKGROUND

This disclosure relates generally to the field of radiation monitoring and dosimetry.

Radiation comes in various forms, including neutrons, x-ray, γ-ray, β-ray or α-particle emission. There are many types of radiation monitors that may be used to determine an amount of radiation exposure, such as ionization detectors, Geiger counters, and thermoluminescent detectors (TLDs). Geiger counters and ionization detectors may determine and display a dose rate (for example, in mRad/hr) or an integrated dose (for example, in Rads) of radiation exposure in real time. Alarm set points may be programmed based on the dose rate or the integrated dose. A Geiger counter or ionization detector may communicate with a computer for data logging or firmware updates. However, Geiger counters and ionization detectors are relatively expensive devices. TLDs allow determination of a dose of radiation based on emission of photons in response to application of heat. TLDs may be comparatively inexpensive, but may only be read after a period of exposure time, typically between one and three months. A degree of radiation exposure may only be determined after-the-fact using a TLD; real time dose information is not available.

A semiconductor, or solid state, radiation monitoring device may comprise a metal-oxide-semiconductor field effect transistor (MOSFET) transistor structure having a gate oxide layer fabricated on bulk silicon. A charge is induced in the FET structure by ionizing radiation exposure and trapped in the gate oxide of the FET by a voltage applied to the gate. The threshold voltage ($V_{th}$) of the FET may change according to the amount of trapped holes. A dose of radiation experienced by the solid state radiation monitoring device may be determined by determination of the change in $V_{th}$.

A FET radiation detector may be fabricated using a fully depleted silicon-on-insulator (FDSOI) FET device that is capable of detecting doses of various types of ionizing radiation, and that exhibits long-term charge retention that enables long-term tracking of total radiation dosage. The FDSOI radiation detector may be made as small or large as desired using semiconductor wafer fabrication technology, and may have a relatively low power drain. A charge may be induced in a buried oxide (BOX) layer of the FDSOI radiation detector by radiation exposure and trapped by voltage applied to a back gate contact or body contact. Determination of the amount of induced charge through determination of the $V_{th}$ is then used to determine an amount of radiation exposure experienced by the FDSOI radiation detector. An example of an FDSOI radiation detector is found in U.S. patent application Ser. No. 12/719,962 (Gordon et al.), filed Mar. 9, 2010, assigned to International Business Machines Corporation, which is herein incorporated by reference in its entirety.

In complementary metal-oxide-semiconductor (CMOS) processing, the wafers being processed are subject to various types of ionizing radiation sources during various processing steps, such as reactive ion etching (RIE) or plasma-enhanced deposition of dielectrics (PECVD). Electron-hole pairs are created in the silicon (Si) wafer being processed by the energy released by the ionizing radiation, leaving the holes trapped in silicon dioxide ($SiO_2$) portions of the wafer, or at a $Si/SiO_2$ interface in the wafer, while electrons usually diffuse to ground within a short time (a few to tens of pico seconds). If a significant amount of holes are trapped in the $SiO_2$, the threshold voltage of the device will shift, leading to deviated or degraded device performance. As device size continues decreasing with aggressive CMOS scaling, achieving and maintaining the threshold voltage of relatively small transistors is an important and challenging task. Creation of holes in $SiO_2$ during the CMOS processing compromises the scaling efforts by causing device performance variations.

Additionally, in today's globalized business and marketing network, electronics products may be exposed to ionizing radiation during various activities that occur during normal business activities such as shipping (such as X-ray at airports) or even potentially from sabotage. Such ionizing radiation exposure may be accidental, incidental, or intentional. For example, a high-end microelectronic chip may be designed in a first country, fabricated through a contracting manufacturer at a lab or factory in another country, assembled in a third country, and shipped back to the first country for final assembly into a product such as a vehicle. Throughout the entire manufacturing and supply chain, there exist numerous occasions when the chips may be damaged due to ionizing radiation exposure by sources that cause instant or progressive degradation.

BRIEF SUMMARY

In one aspect, a method for forming a semiconductor device includes forming an implant mask on a substrate, such that a first portion of the substrate is located under the implant mask, and a second portion of the substrate is exposed; performing oxygen ion implantation of the substrate; removing the implant mask; and forming a first field effect transistor (FET) on the first portion of the substrate, and forming a second FET on the second portion of the substrate, wherein the second FET has a higher radiation sensitivity than the first FET.

In another aspect, a semiconductor device includes a first field effect transistor (FET) located on a substrate; and a second FET located on the substrate, the second FET comprising a first buried oxide (BOX) region located underneath a channel region of the second FET, wherein the first BOX region of the second FET is configured to cause the second FET to have a higher radiation sensitivity that the first FET.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 5A is a cross-sectional view illustrating an embodiment of a substrate after formation of an implant mask.

DETAILED DESCRIPTION

Embodiments of an on-chip radiation dosimeter, and methods of making an on-chip radiation dosimeter, are provided, with exemplary embodiments being discussed below in detail. To quantitatively track the radiation history of an electronic device such as a CMOS chip, an FDSOI on-chip radiation dosimeter may be formed on the electronic device. The FDSOI dosimeter is fabricated such that it is embedded on the device chip and experiences the same dosage of radiation during the life of the chip as the active devices. The FDSOI dosimeter may have a higher sensitivity to radiation than active devices located on the same chip, allowing for accurate measurement of the radiation exposure experienced by the chip at any stage in the life cycle of the chip by measuring the change in the threshold voltage ($V_{th}$) of the FDSOI dosimeter. This radiation exposure information may then be used to verify whether any processing steps has a potential impact on the device performance, and/or the whether security and safety of a manufacturing and supply chain is compromised. The on-chip FDSOI radiation dosimeter may be fabricated on either bulk-Si or SOI wafers in various embodiments.

The sensitivity ($\Delta V_{th}$/radiation dose) of the on-chip FDSOI radiation dosimeter is enhanced by engineering the properties of a buried oxide layer (BOX) that is located underneath the FDSOI dosimeter, allowing the FDSOI radiation dosimeter to be made relatively sensitive as compared to the active devices on the chip so that an accurate picture of the total amount of radiation experienced by the chip may be obtained. The BOX layer underneath the FDSOI dosimeter acts as the charge-trapping layer, which is decoupled from the top gate and gate oxide of the FDSOI dosimeter. Trapped charge in the BOX layer is not affected by the front gate voltage applied to the FDSOI dosimeter for electrical readout of the $V_{th}$. In contrast, in a transistor-type dosimeter that is built on bulk-Si and that uses the gate oxide layer as the charge-trapping layer, the amount of charge trapped in the gate oxide layer is changed by application of the front gate voltage applied for electrical readout of the $V_{th}$. Therefore, the FDSOI radiation dosimeter with the charge trapped in the BOX layer exhibits long-term retention of the trapped charge, allowing long-term determination of the accumulated radiation dose to which the chip is exposed.

Figure 1:
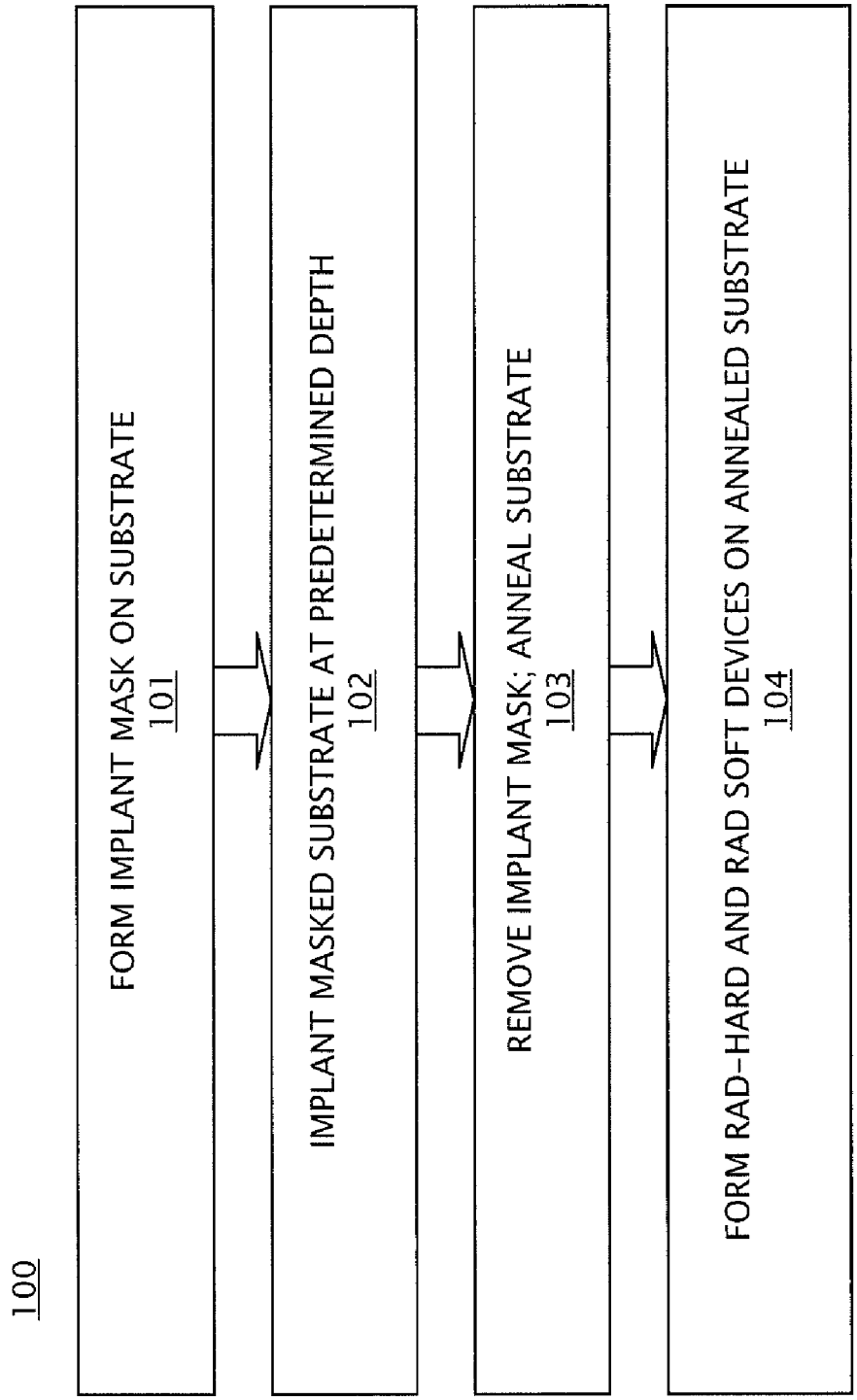
FIG. 1 illustrates a flowchart of an embodiment of a method of making an on-chip radiation dosimeter.
Figure 2:
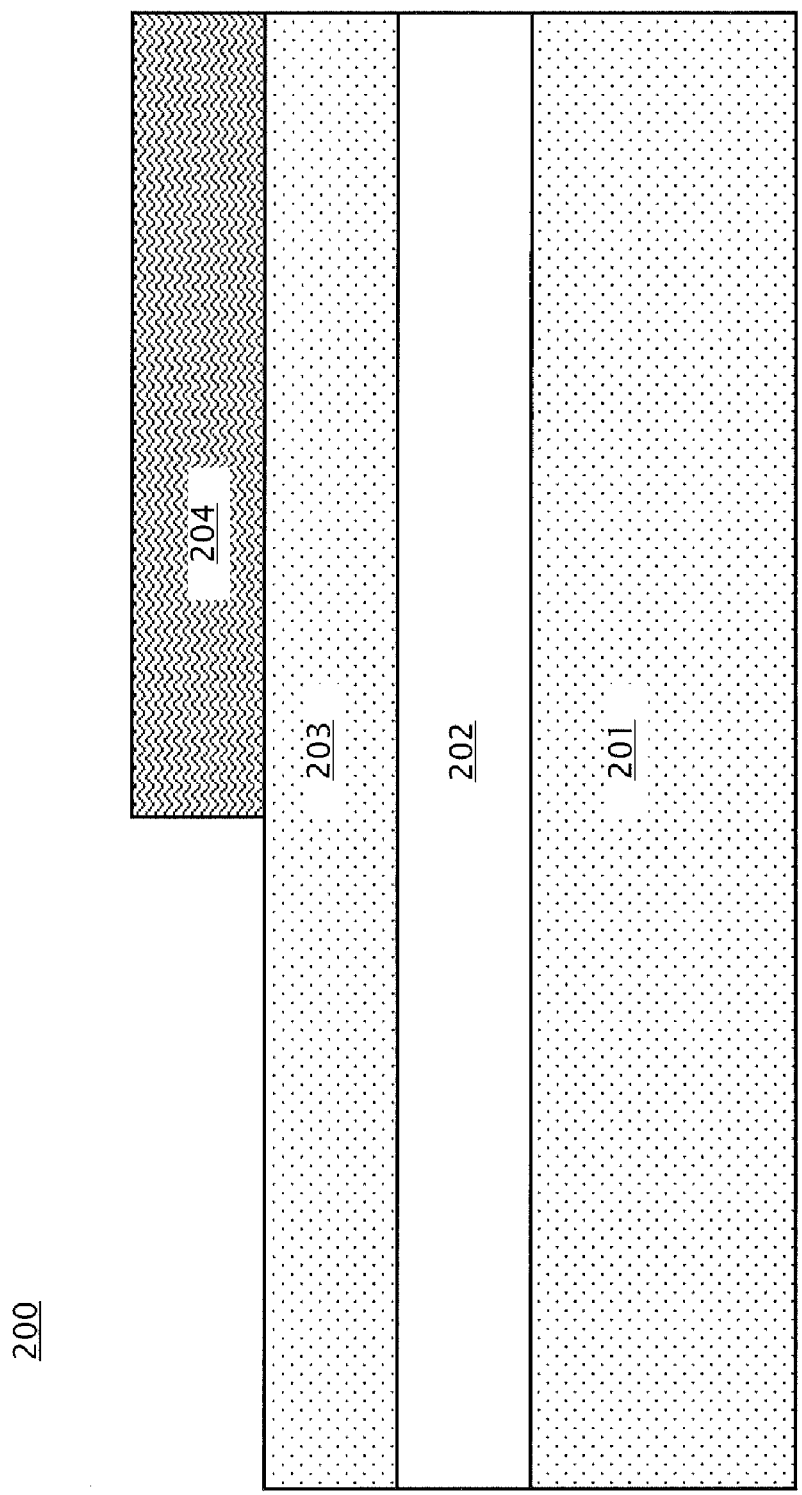
FIG. 2 is a cross-sectional view illustrating an embodiment of a substrate after formation of an implant mask.
Figure 3:
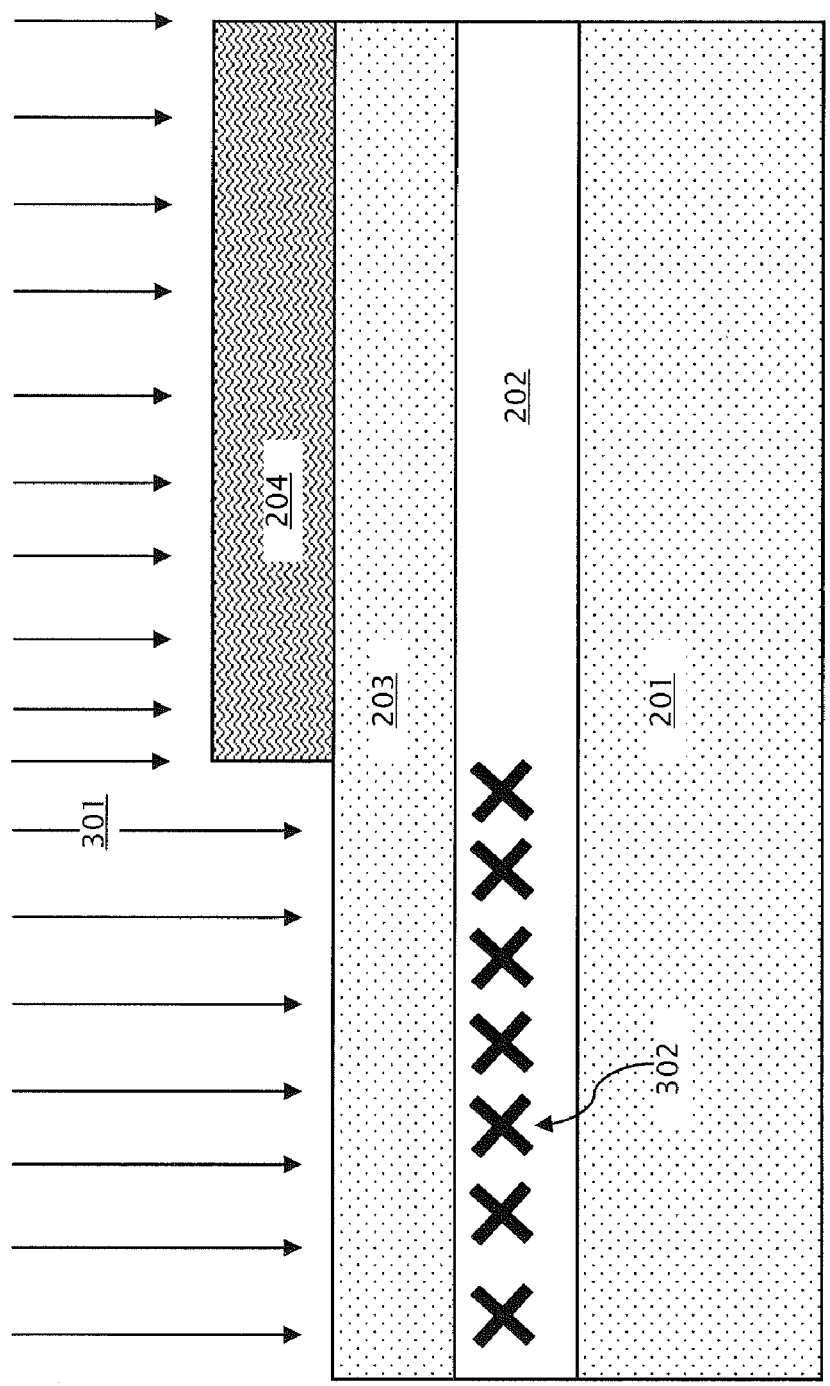
FIG. 3 is a cross-sectional view illustrating the device of FIG. 2 during implantation.
Figure 4:
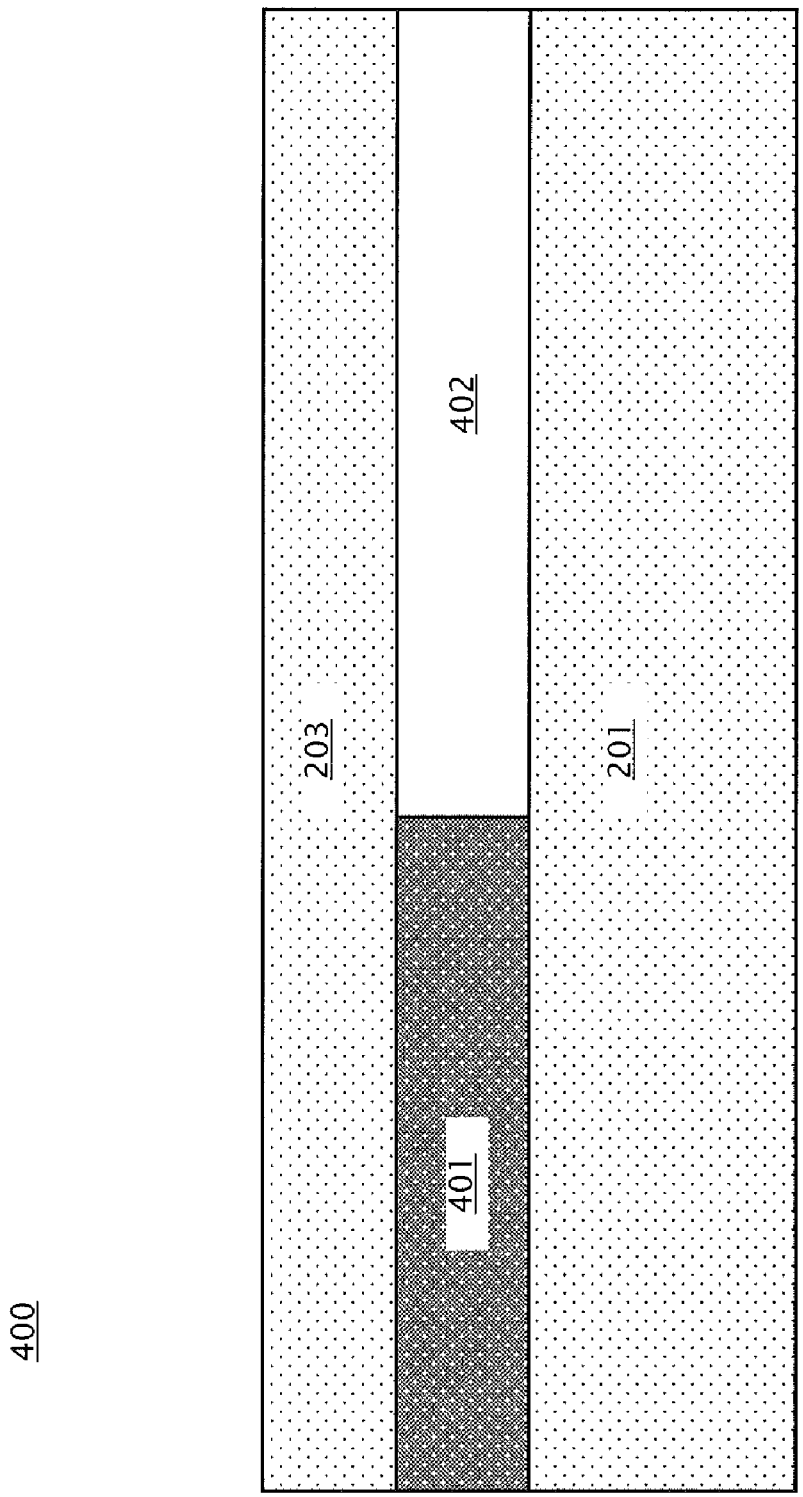
FIG. 4 is a cross-sectional view illustrating the device of FIG. 3 after removal of the implant mask and annealing.

FIG. 1 shows a flowchart of a method 100 of forming a semiconductor device comprising an on-chip FDSOI radiation dosimeter. Method 100 may be used to form an on-chip FDSOI radiation dosimeter on either bulk-Si or SOI substrates in various embodiments. FIGS. 2-4 and 5A-7 illustrate embodiments in which SOI is used as the starting substrate, such as may be used for applications including high-performance chips. FIGS. 2-4 illustrate an embodiment that includes a single implantation step, and FIGS. 5A-7 illustrate an embodiment with two implantation steps.

Figure 8:
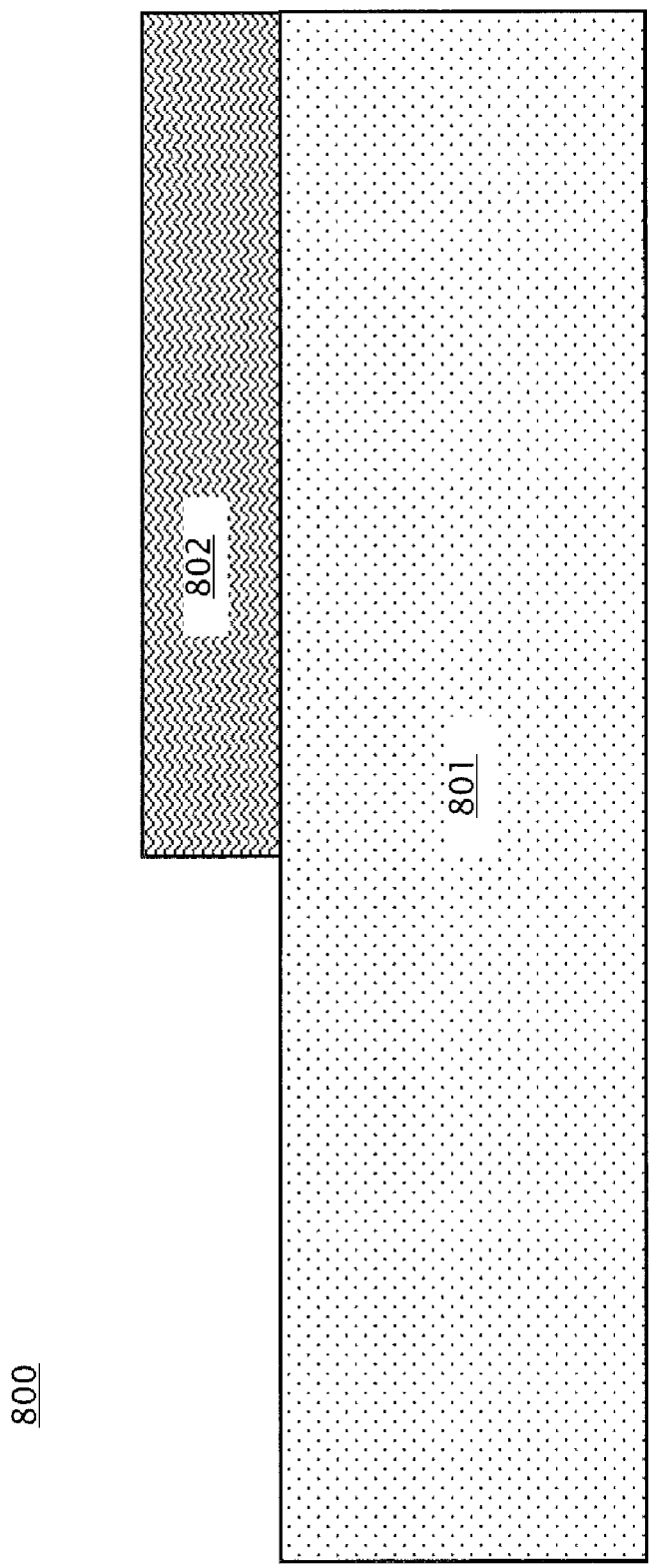
FIG. 8 is a cross-sectional view illustrating an embodiment of a substrate after formation of an implant mask.
Figure 9:
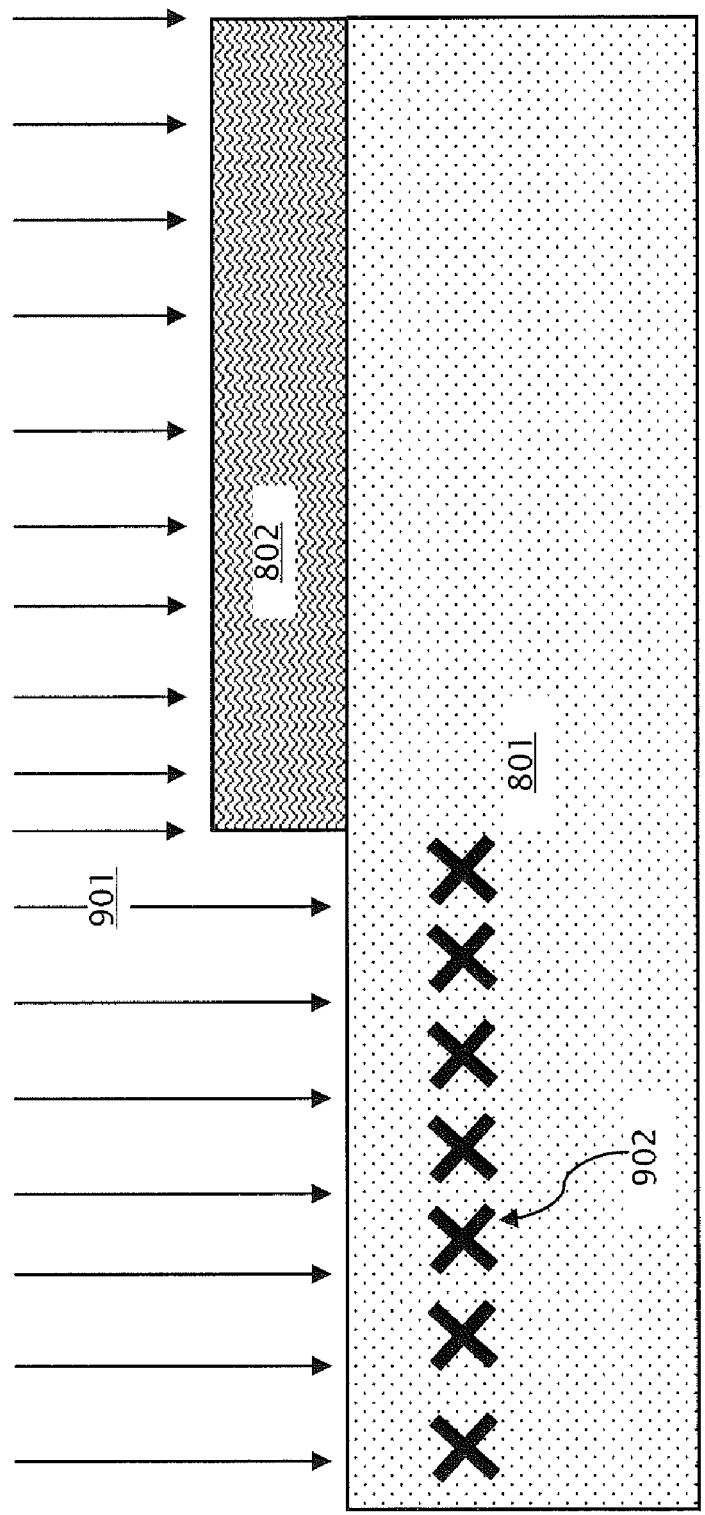
FIG. 9 is a cross-sectional view illustrating the device of FIG. 8 during implantation.
Figure 10:
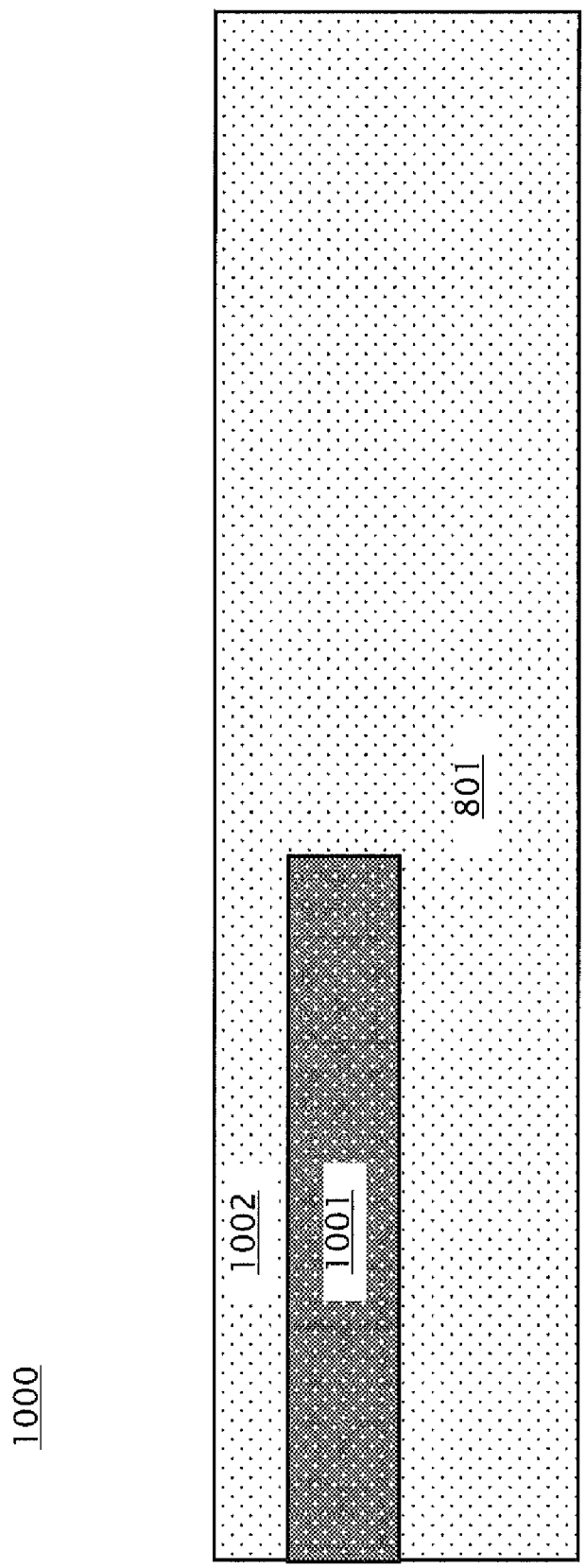
FIG. 10 is a cross-sectional view illustrating the device of FIG. 9 after removal of the implant mask and annealing.

FIGS. 8-10 illustrate an embodiment in which bulk-Si is used as the starting substrate, which may be used for applications including lower-cost, lower-performance chips.

In a first embodiment of application of method 100 of FIG. 1, in block 101 an implant mask is formed on an SOI substrate. The first embodiment of method 100 of FIG. 1 is discussed with respect to FIGS. 2-4. As shown in FIG. 2, device 200 is an SOI substrate, including bottom Si layer 201, BOX layer 202 and top Si layer 203. Implant mask 204 is formed on top Si layer 203. Implant mask 204 may comprise $SiO_2$. Implant mask 204 may be formed by thermal oxidation or deposition of $SiO_2$ material, which may then be patterned using photolithography to expose the area where the on-chip FDSOI radiation dosimeter is to be located in various embodiments. In some embodiments, the implant mask 204 may have a thickness of about 500 nanometers (nm) to about 750 nm. Appropriate thinning, down to about 40 nanometers (nm) or less, of the top Si layer 203 in the exposed region of the top Si layer 203 may be performed as needed to ensure a fully-depleted Si channel of the finished radiation dosimeter under intrinsic conditions.

Then, returning to method 100 of FIG. 1, in block 102, oxygen ions are implanted into the substrate to engineer the properties of the BOX layer in the region that is not located underneath the implant mask, i.e., the region in which the FDSOI dosimeter will be located. Implantation is performed with a targeted implantation depth in the middle of the BOX layer to create the desired amount, about $10^{12}$ per centimeter-squared ($cm^2$) or greater, of defects, referred to as hole traps, in the part of BOX layer that is not located underneath the implant mask. FIG. 3 shows the device 200 of FIG. 2 during oxygen ion implantation 301. Oxygen ion implantation 301 forms hole traps 302 in the BOX layer 202 in the portion of BOX layer 202 that is not located underneath the implant mask 204. The energy used for oxygen ion implantation 301 may range from about 30 kilo-electron volts (keV) to about 160 keV in some embodiments.

Next, returning again to method 100 of FIG. 1, in block 103 the implant mask is removed and the implanted device is annealed to cure the damage in the SOI caused by the implantation that was performed in block 102. FIG. 4 shows the device of FIG. 3 after removal of implant mask 204 and annealing. The implant mask 204 may be removed by etching in some embodiments. The anneal may be performed at a temperature from about 980° C. to about 1050° C. After the anneal, the BOX layer in device 400 of FIG. 4 comprises radiation soft BOX layer 401, which is the portion of BOX layer 202 that was implanted, and radiation hard BOX layer 402, which is the portion of BOX layer 202 that was not implanted. Lastly, after annealing, flow proceeds to block 104 of method 100, in which devices, such as CMOS transistors, are built on the annealed device. The transistor channel regions will be located in the top Si layer 203. A transistor that is built on the radiation soft BOX layer 401 will have heightened radiation sensitivity and function as an on-chip radiation dosimeter, while a transistor built on the radiation hard BOX layer 402 will act as normal CMOS device. Block 104 of method 100 is discussed in further detail below with respect to FIGS. 11A-B.

In a second embodiment of application of method 100 of FIG. 1, in block 101 an implant mask 504 is formed on an SOI substrate. The second embodiment of method 100 of FIG. 1 is discussed with respect to FIGS. 5A-7. As shown in FIG. 5A, device 500 is an SOI substrate, including bottom Si layer 501, BOX layer 502 and top Si layer 503. The implant mask 504 is formed on top Si layer 503, and may comprise $SiO_2$. Implant mask 504 may be formed by thermal oxidation or deposition of $SiO_2$ material, which may then be patterned using photolithography to expose the area where one or more on-chip FDSOI radiation dosimeters are to be located in various embodiments. In some embodiments, the implant mask 504 may have a thickness of about 500 nm to about 750 nm. Appropriate thinning (down to about 40 nm or less) of the top Si layer 503 in the exposed region of the top Si layer 503 may be performed as needed to ensure a fully-depleted Si body for the finished FDSOI radiation dosimeter under intrinsic conditions.

Figure 5B:
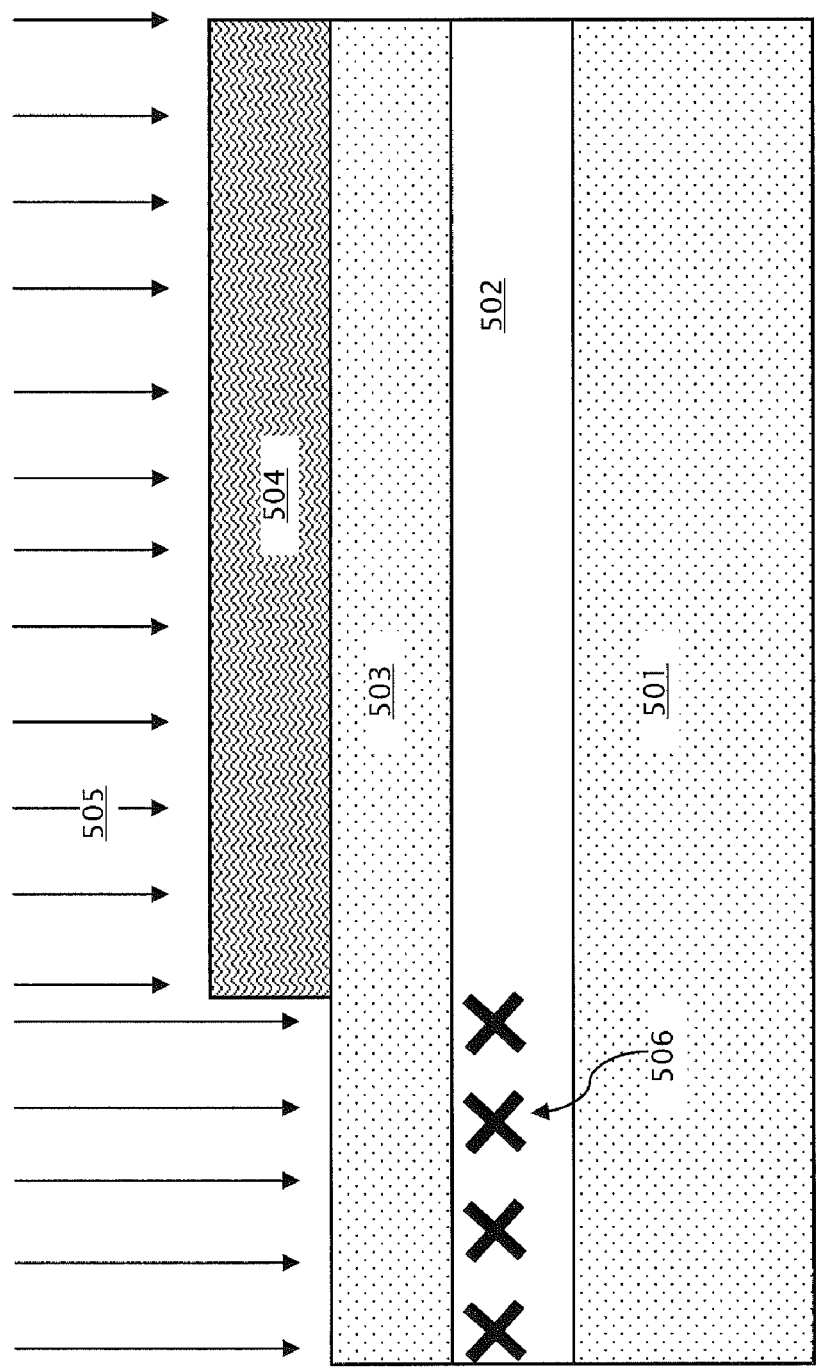
FIG. 5B is a cross-sectional view illustrating the device of FIG. 5A during implantation.

Then, returning to method 100 of FIG. 1, in block 102, oxygen ions are implanted into the substrate to engineer the properties of the BOX layer in the region that is not located underneath the implant mask. Implantation is performed with a targeted implantation depth in the middle of the BOX layer to create the desired amount (about $10^{12}$ per $cm^2$ or greater) of defects, referred to as hole traps, in the part of BOX layer that is not located underneath the thick implant mask. FIG. 5B shows the device 500 of FIG. 5A during first oxygen ion implantation 505. First oxygen ion implantation 505 forms hole traps 506 in the BOX layer 502 in the portion of BOX layer 502 that is not located underneath the implant mask 504. The energy used for first oxygen ion implantation 505 may range from about 30 kilo-electron volts (keV) to about 160 keV in some embodiments.

Figure 6A:
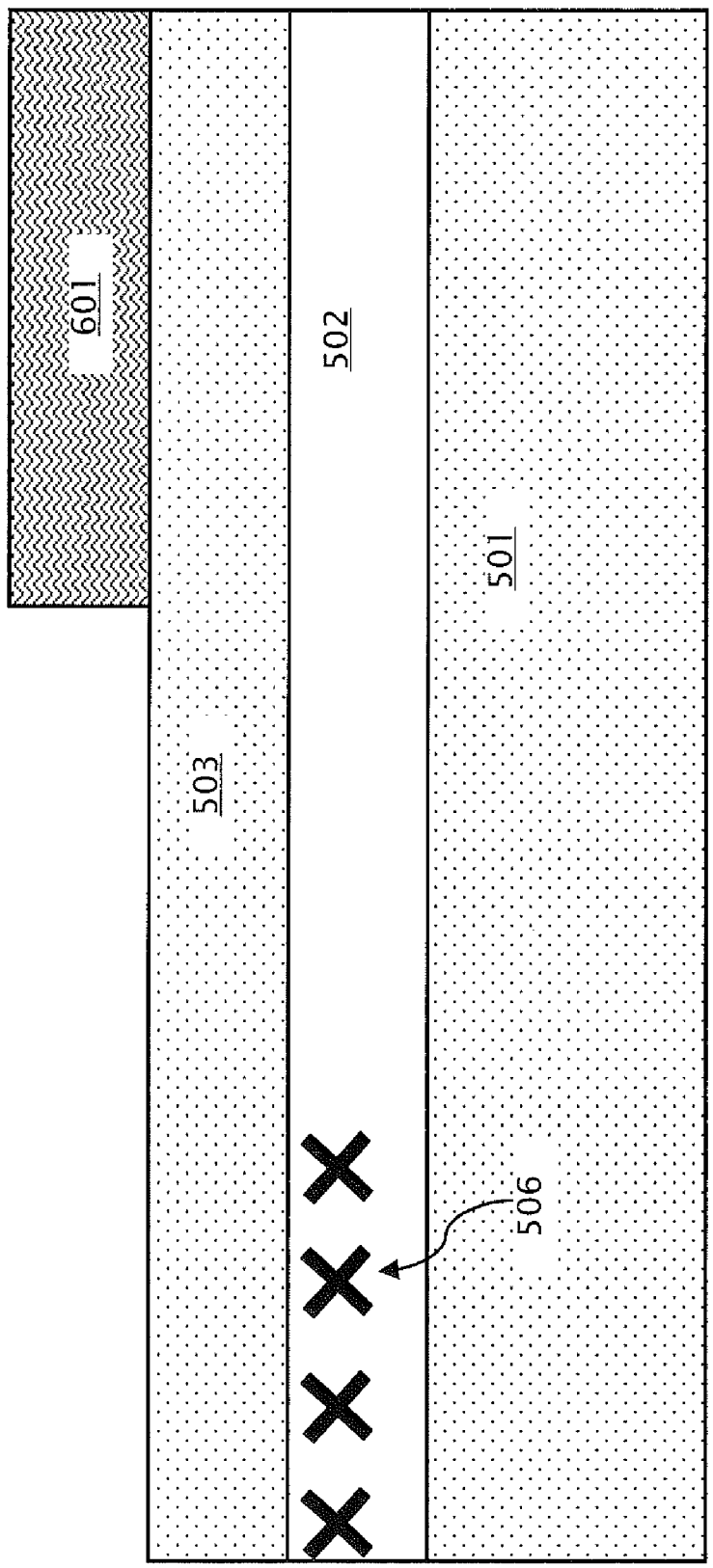
FIG. 6A is a cross-sectional view illustrating an embodiment of the device of FIG. 5B after removal of a portion of the implant mask.
Figure 6B:
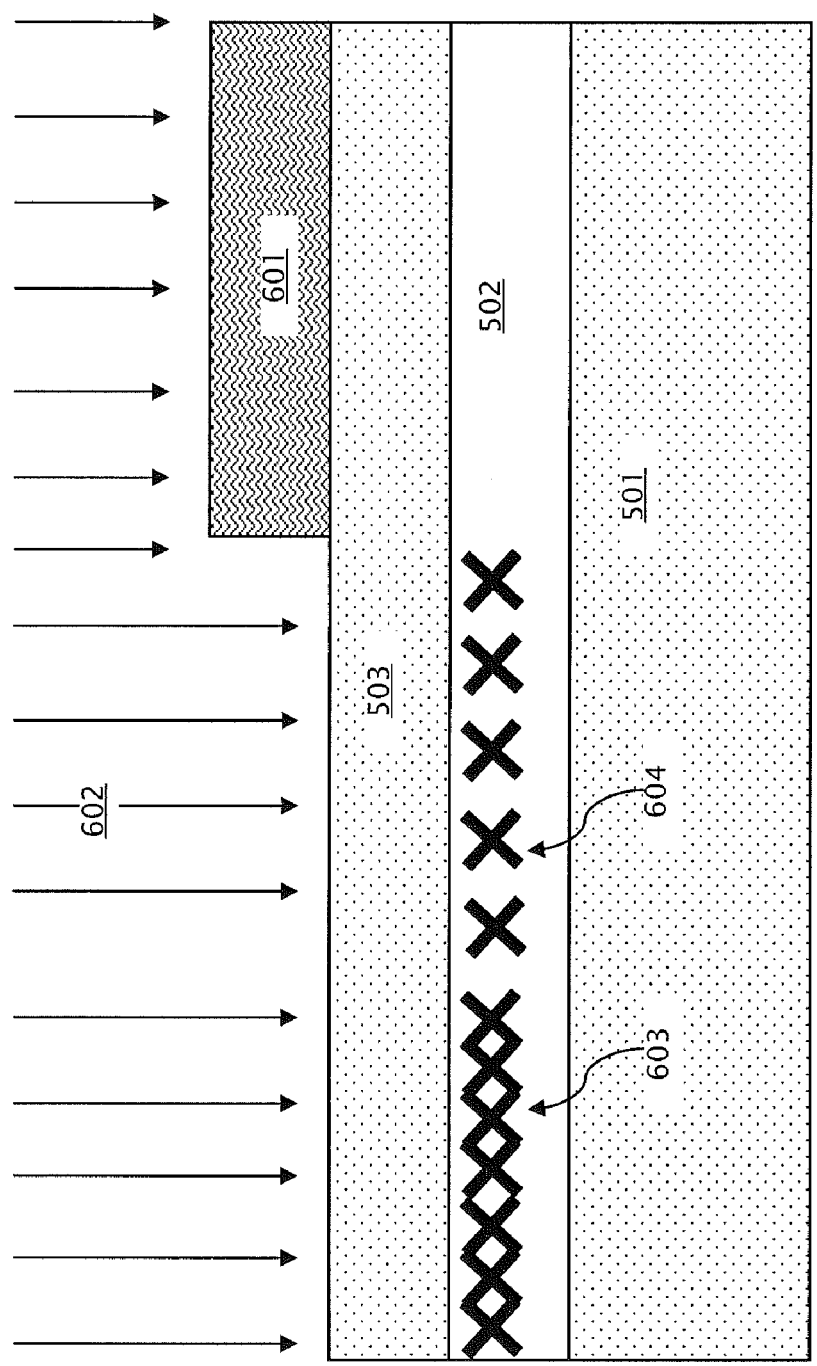
FIG. 6B is a cross-sectional view illustrating the device of FIG. 6A during implantation.

Then, turning again to the second embodiment of method 100 of FIG. 1, blocks 101 and 102 are repeated. First, a portion of the implant mask is removed by photolithography and chemical etching (for example, by diluted hydrofluoric acid or reactive ion etch) in block 101. Removal of a portion of the implant mask results in a patterned implant mask that exposes a larger area of the SOI layer. After removal of the portion of the implant mask to form the patterned implant mask, then flow proceeds to block 102 of method 100, and oxygen ions are implanted into the substrate a second time to engineer the properties of the BOX layer in the region that is not located underneath the patterned implant mask. FIG. 6A shows the device of FIG. 5B after removal of a portion of the implant mask 504 to form patterned implant mask 601, and FIG. 6B shows the device of FIG. 6A during second oxygen ion implantation 602. The energy used for SECOND oxygen ion implantation 602 may range from about 30 kilo-electron volts (keV) to about 160 keV in some embodiments. Second oxygen ion implantation 602 of FIG. 6B and first oxygen ion implantation 505 of FIG. 5B may be performed with the same dose or different doses in various embodiments. After second oxygen ion implantation 602, different densities of hole traps are formed in regions 603 and 604 in the BOX layer 502, as shown in FIG. 6B. The hole traps 603 formed in the BOX layer 502 have a higher density than the hole traps 604 formed in the adjacent region in BOX layer 502, as the region of BOX layer 502 that includes hole traps 603 was implanted twice, and the region of BOX layer 502 that includes hole traps 604 was implanted once.

Figure 7:
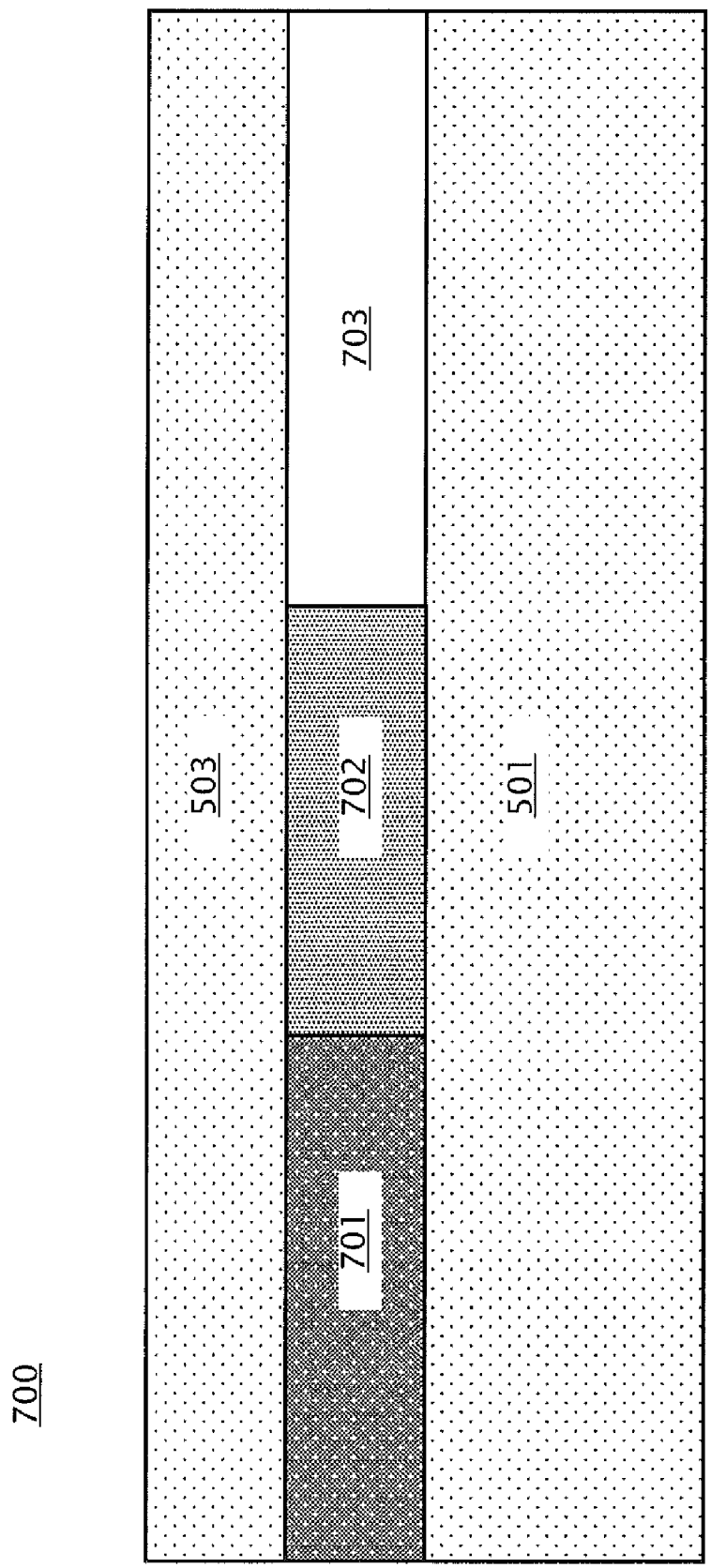
FIG. 7 is a cross-sectional view illustrating the device of FIG. 6B after removal of the implant mask and annealing.

Next, returning again to method 100 of FIG. 1, in block 103 the implant mask is removed and the implanted device is annealed to cure the damage in the SOI caused by the implantation that was performed in block 102. FIG. 7 shows the device of FIG. 6B after removal of patterned implant mask 601 and annealing. The patterned implant mask 601 may be removed by etching in some embodiments. The anneal may be performed at a temperature from about 980° C. to about 1050° C. After the anneal, the BOX layer in device 700 comprises first radiation soft BOX layer 701, which is the portion of BOX layer 502 that was subject to both first oxygen ion implantation 505 and second oxygen ion implantation 602, second radiation soft BOX layer 702 that was subject to second oxygen ion implantation 602, and radiation hard BOX layer 703, which is the portion of BOX layer 502 that was not implanted. Lastly, after annealing, flow proceeds to block 104 of method 100, in which devices, such as CMOS transistors, are built on the annealed device. The transistor channel regions will be located in top Si layer 503. Block 104 of method 100 is discussed in further detail below with respect to FIGS. 11A-B. A transistor that is built on the first or second radiation soft BOX layers 701 or 702 will have heightened radiation sensitivity and function as an on-chip radiation dosimeter, while a transistor built on the radiation hard BOX layer 703 will act as normal CMOS device. Devices built on first radiation soft BOX layer 701 will have a higher radiation sensitivity than devices built on second radiation soft BOX layer 702. Because a FDSOI dosimeter may only be accurate up to a total ionizing dose (TID) that is specific to the dosimeter, inclusion of different dosimeters built on first and second radiation soft BOX layers 701 and 702 having different radiation sensitivities on the same device allows measurement of a wider range of radiation exposure values.

In a third embodiment of application of method 100 of FIG. 1, in block 101 an implant mask is formed on bulk-Si substrate. The third embodiment of method 100 of FIG. 1 is discussed with respect to FIGS. 8-10. As shown in FIG. 8, device 800 is a bulk-Si substrate 801. Implant mask 802 is formed on bulk-Si substrate 801, and may comprise $SiO_2$. Implant mask 802 may be formed by one of thermal oxidation or deposition of the $SiO_2$ material, which may then be patterned using photolithography to expose the area where the on-chip FDSOI radiation dosimeter is to be located. In some embodiments, the implant mask 802 may have a thickness of about 500 nm to about 750 nm.

Then, returning to method 100 of FIG. 1, in block 102, oxygen ions are implanted into the substrate to engineer the properties of the bulk-Si in the region that is not located underneath the implant mask. Implantation is performed with a targeted implantation depth of about 40 nm or less from the top of the bulk-Si substrate 801 to ensure a fully-depleted Si body for the radiation dosimeter under intrinsic conditions. The implantation creates a desired amount (about $10^{12}$ per $cm^2$ or greater) of defects, referred to as hole traps, in the targeted part of bulk-Si substrate that is not located underneath the implant mask. FIG. 9 shows the device 800 of FIG. 8 during oxygen ion implantation 901. Oxygen ion implantation 901 forms hole traps 902 in the part of the bulk-Si substrate 801 that is not located underneath the implant mask 802 at the desired implantation depth (about 40 nm or less). The energy used for oxygen ion implantation 901 may range from about 30 keV to about 160 keV in some embodiments.

Next, returning again to method 100 of FIG. 1, in block 103 the implant mask is removed and the implanted device is annealed to form a BOX layer in the implanted portion of the bulk-Si. FIG. 10 shows the device of FIG. 9 after removal of implant mask 802 and annealing. The implant mask 802 may be removed by etching in some embodiments. The anneal for the implanted bulk-Si substrate 801 may be performed at a temperature of about 1300° C. in an ambient environment of argon (Ar) with no more than 3% of oxygen ($O_2$). After the anneal, a BOX layer 1001, located underneath a top Si layer 1002, is formed in bulk-Si substrate 801, resulting in a hybrid bulk/SOI substrate 1000 as shown in FIG. 10. Lastly, after annealing, devices, such as CMOS transistors, are built on the annealed device in block 104 of method 100 of FIG. 1. A transistor that is built on the BOX layer 1001 with a channel located in top Si layer 1002 will have heightened radiation sensitivity and function as an on-chip radiation dosimeter, while a transistor built on the bulk-Si 801 will act as normal CMOS device. Block 104 of FIG. 1 is discussed in further detail below with respect to FIGS. 11A-B.

Figure 11A:
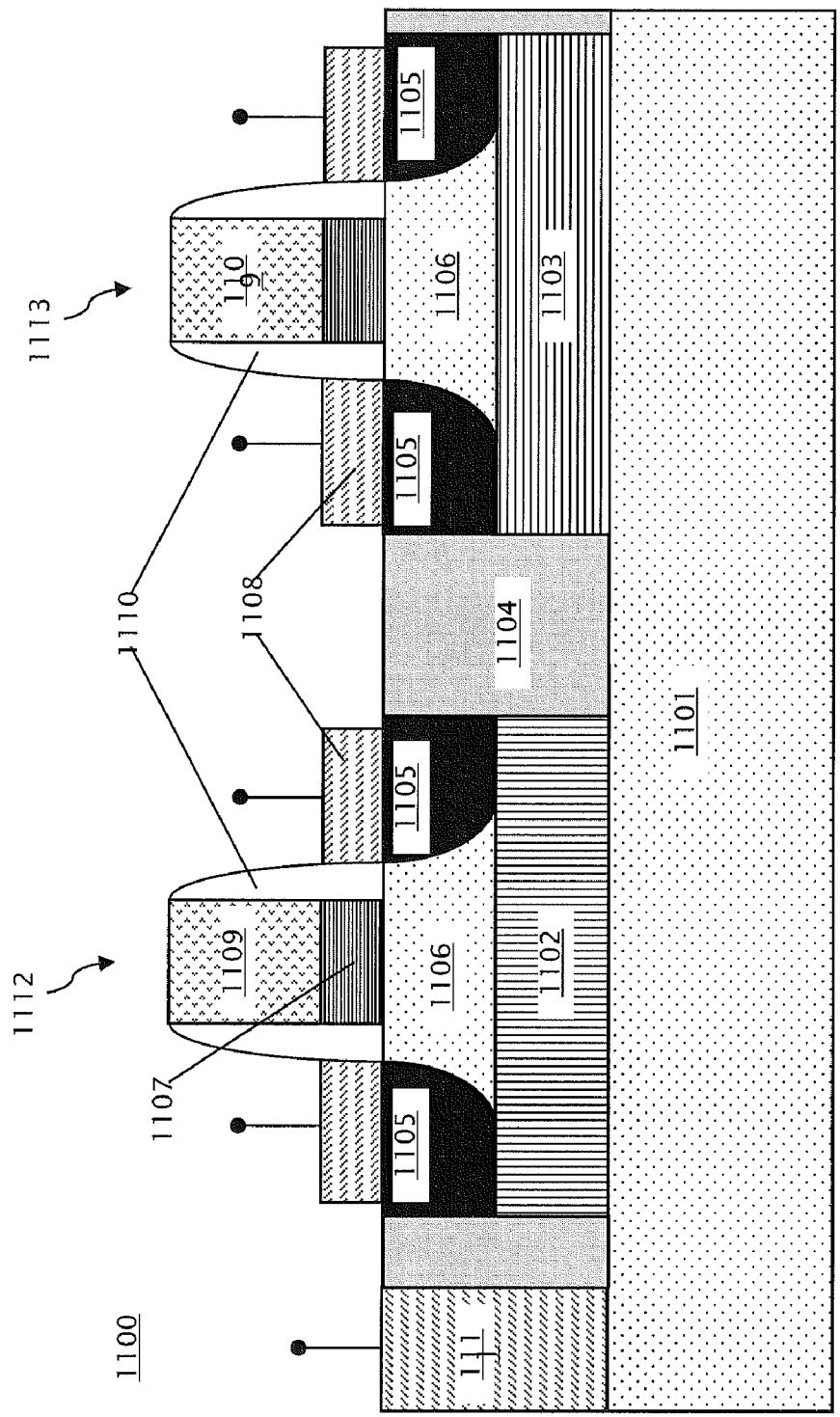
FIG. 11A is a cross-sectional view illustrating a semiconductor device including an on-chip radiation dosimeter.
Figure 11B:
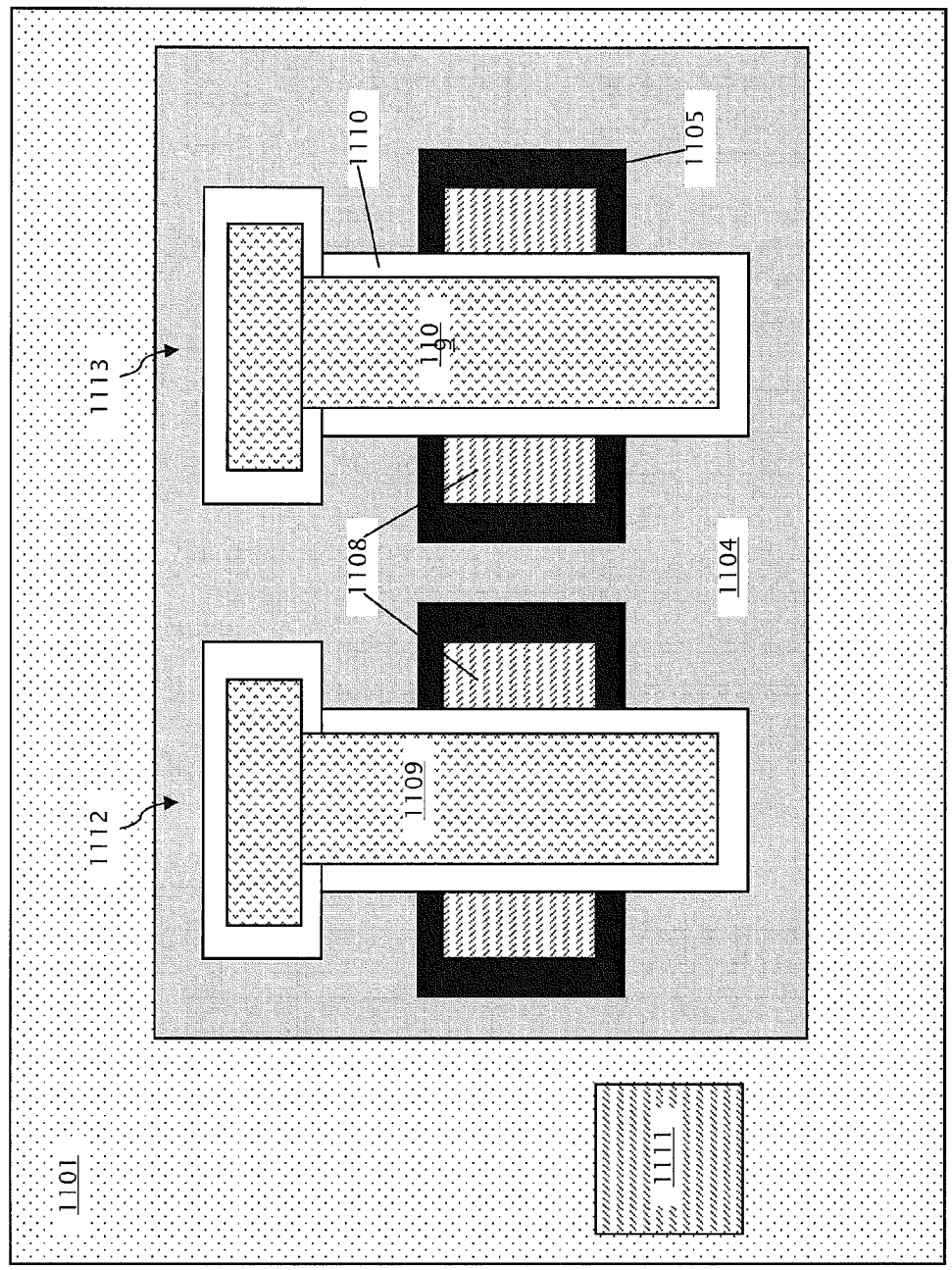
FIG. 11B is a top view of the device of FIG. 11A.

An embodiment of a CMOS device 1100 including an FDSOI radiation dosimeter, such as is formed in block 104 of method 100 of FIG. 1, is shown in FIGS. 11A-B. The device 1100 may be built on any of device 400 of FIG. 4, device 700 of FIG. 7, and device 1000 of FIG. 10, using standard FET fabrication techniques. FIG. 11A shows a cross-section of device 1100, including a first FET 1112 comprising a FDSOI radiation dosimeter, and a second FET 1113 comprising a normal CMOS device. The first FET 1112 and second FET 1113 are electrically isolated from one another by shallow trench isolation (STI) regions 1104. The first FET 1112 is built on a radiation soft BOX layer 1102, and includes Si channel region 1106, source/drain regions 1105, source/drain contacts 1108, gate dielectric 1107, gate contact 1109, and spacers 1110. Radiation soft BOX layer 1102 may comprise any of radiation soft BOX layer 401 that was described with respect to the first embodiment of application of method 100 (FIGS. 2-4), either of radiation soft BOX layers 701 or 702 that were described with respect to the second embodiment of application of method 100 (FIGS. 5A-7), or BOX layer 1001 that was described with respect to the third embodiment of application of method 100 (FIGS. 8-10). The second FET 1113 is built on radiation hard layer 1103, which may comprise BOX or bulk-Si in various embodiments, and also includes Si channel region 1106, source/drain regions 1105, source/drain contacts 1108, gate dielectric 1107, gate contact 1109, and spacers 1110. Radiation hard layer 1103 may comprise any of radiation hard BOX layer 402 that was described with respect to the first embodiment of application of method 100 (FIGS. 2-4), radiation hard BOX layer 703 that was described with respect to the second embodiment of application of method 100 (FIGS. 5A-7), or bulk-S 801 that was described with respect to the third embodiment of application of method 100 (FIGS. 8-10). The radiation dose experienced by device 1100 may be determined by applying a gate voltage to the gate contact 1109 of first FET 1112 and determining the threshold voltage of FET 1112. Optional body contact 1111 may be used to apply a voltage to enhance the trapping of radiation-induced charge in the radiation soft BOX layer 1102 of the first FET 1112.

FIG. 11B shows a top view of the device 1100 including a first FET 1112 and a second FET 1113. First and second FETs 1112 and 1113 are surrounded by STI region 1104 on silicon substrate 1101, and each include gate contact 1109, spacers 1110, source/drain contact 1108, and source/drain regions 1105. Body contact 1111 is optional depending on the type of radiation that first FET 1112 is configured to detect. Optional body contact 1111 may be used to apply a voltage to aid in trapping radiation-induced charge in the radiation soft BOX layer 1102 of the first FET 1112. The radiation dose experienced by device 1100 may be determined by applying a gate voltage to the gate contact 1109 of first FET 1112 and determining the threshold voltage of FET 1112.

FIGS. 11A-B are shown for illustrative purposes only. A device including an on-chip FDSOI dosimeter may include any appropriate number and layout of FDSOI radiation dosimeters and regular CMOS devices, and the FDSOI radiation dosimeters and regular CMOS devices may have any appropriate gate stack and source/drain makeup and configuration. An on-chip FDSOI dosimeter such as is included in device 1100 may be used to determine radiation exposure from any appropriate source and for any appropriate application.

In some embodiments, a device including multiple on-chip FDSOI radiation dosimeters may include filters to allow identification of what type of radiation exposure is experienced by the device. In such application, multiple dosimeters are formed on the device, and different filter layers that correspond to different types of radiation are formed over different dosimeters. For example, a cover may be formed over an on-chip FDSOI dosimeter than prevents the dosimeter from detecting alpha-particles in some embodiments, in further embodiments, a thermal neutron conversion layer may be formed over an on-chip FDSOI dosimeter to enhance neutron detection efficiency of the on-chip FDSOI dosimeter, and in still further embodiments, a filter layer that attenuates low energy x-rays but allow the passage of high energy gammas may be formed over an on-chip FDSOI dosimeter on the device. Formation of a plurality of on-chip FDSOI dosimeters that are covered with different filter layers allows for accurate characterization of the type and amount of radiation exposure experienced by the device.

Figure 12:
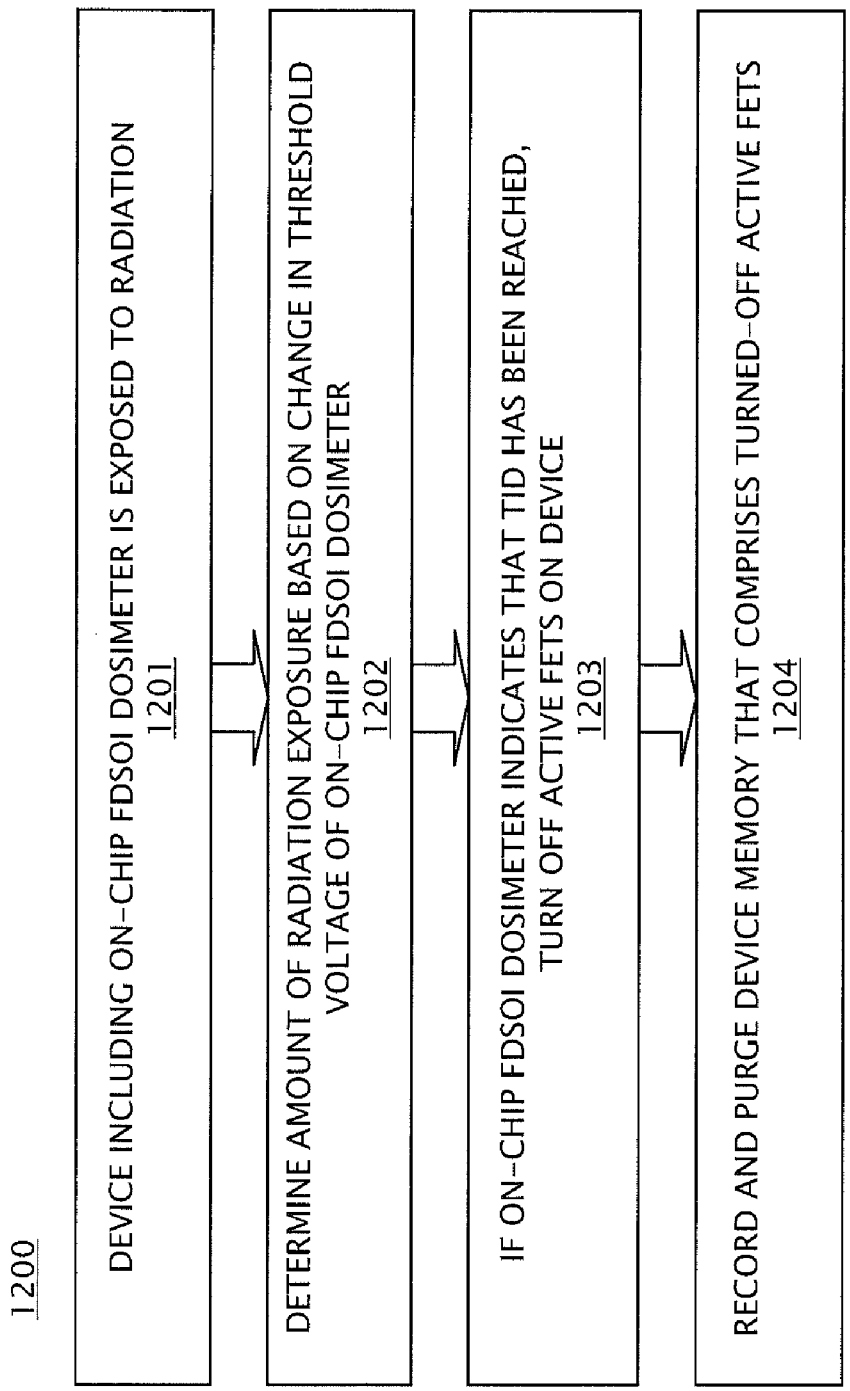
FIG. 12 is a flowchart of an embodiment of a method of operating a semiconductor device including an on-chip radiation dosimeter.

FIG. 12 shows a flowchart of a method 1200 of operating a device including an on-chip FDSOI dosimeter, such as device 1100 of FIGS. 11A-B. In block 1201, the device including an on-chip FDSOI dosimeter (such as first FET 1112) is exposed to radiation, inducing a change in the threshold voltage of the on-chip FDSOI dosimeter. In block 1202, the change in the threshold voltage of the on-chip FDSOI dosimeter is determined, and the amount of radiation exposure experienced by the device is determined from the change the in threshold voltage of the on-chip FDSOI dosimeter. In block 1203, in the event the on-chip radiation dosimeter indicates that radiation exposure corresponding to a TID of the on-chip radiation dosimeter has been experienced by the device, the active FETs (such as second FET 1113) may be turned off. Lastly, in block 1204, if the turned-off active FETs in the device comprise computer memory, the computer memory may be recorded and purged to avoid corruption due to the radiation exposure.

The technical effects and benefits of exemplary embodiments include accurate monitoring of an amount of radiation experienced by a CMOS device from various sources.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for forming a semiconductor device, the method comprising:
forming an implant mask on a substrate, such that a first portion of the substrate is located under the implant mask, and a second portion of the substrate is exposed wherein the substrate comprises a silicon-on-insulator (SOI) substrate, comprising a top silicon layer, a buried oxide BOX layer located under the top silicon layer, and a bulk silicon layer located under the BOX layer, and wherein the implant mask is formed on the top silicon layer in the first portion of the substrate;
performing oxygen ion implantation of the substrate;
removing a portion of the implant mask to form a patterned implant mask after performing oxygen ion implantation of the substrate, wherein the patterned implant mask is located on a first portion of the first portion of the substrate, and exposes a second portion of the first portion of the substrate;
performing a second oxygen ion implantation of the substrate after formation of the patterned implant mask, wherein the second oxygen ion implantation forms hole traps in the BOX layer in the second portion of the first portion of the substrate, and wherein the number of hole traps per unit of area in the BOX layer in the second portion of the first portion of the substrate is less than a number of hole traps per unit of area in the BOX layer in the second portion of the substrate;
removing the implant mask and the patterned implant mask; and
forming a first field effect transistor (FET) on the first portion of the substrate, and forming a second FET on the second portion of the substrate, wherein the second FET has a higher radiation sensitivity than the first FET.

2. The method of claim 1, wherein the oxygen ion implantation of the substrate has an energy from about 30 kiloelectron volts (keV) to about 160 keV.

3. The method of claim 1, wherein the implant mask has a thickness from about 500 nanometers to about 750 nanometers.

4. The method of claim 1, wherein the oxygen ion implantation forms hole traps in the BOX layer in the first portion of the substrate, and wherein the BOX layer in the first portion of the substrate comprises about $10^{12}$ hole traps per centimeter squared or greater.

5. The method of claim 1, wherein the first FET is formed on the first portion of the first portion of the substrate, and further comprising forming a third FET on the second portion of the first portion of the substrate, wherein a radiation sensitivity of the third FET is higher than the radiation sensitivity of the first FET, and wherein the radiation sensitivity of the third FET is lower than the radiation sensitivity of the second FET.

6. The method of claim 1, further comprising annealing the substrate before forming the first and second FETs.

7. The method of claim 6, wherein the substrate comprises a silicon-on-insulator (SOI) substrate, and the annealing is performed at a temperature from about 980° C. to about 1050° C.

8. The method of claim 6, wherein the substrate comprises a bulk silicon substrate, and the annealing is performed at a temperature of about 1300° C. in an ambient environment of argon and oxygen.

9. The method of claim 1, wherein the substrate comprises a bulk silicon substrate, and wherein the oxygen ion implantation is configured to form a buried oxide (BOX) layer in the second portion of the substrate.

10. The method of claim 1, wherein a silicon channel region of the second FET has a thickness of about 40 nanometers or less.

11. The method of claim 1, further comprising determining a radiation dosage experienced by the semiconductor device by determining a change in a threshold voltage of the second FET, and in the event the radiation dosage is greater than a total ionizing dose of the second FET, turning off the first FET.

12. A method for forming a semiconductor device, the method comprising:
forming an implant mask on a substrate, such that a first portion of the substrate is located under the implant mask, and a second portion of the substrate is exposed, wherein the substrate comprises a silicon-on-insulator (SOI) substrate, comprising a top silicon layer, a buried oxide BOX layer located under the top silicon layer, and a bulk silicon layer located under the BOX layer, and wherein the implant mask is formed on the top silicon layer in the first portion of the substrate;
performing oxygen ion implantation of the substrate;
removing a portion of the implant mask to form a patterned implant mask after performing oxygen ion implantation of the substrate, wherein the patterned implant mask is located on a first portion of the first portion of the substrate, and exposes a second portion of the first portion of the substrate
removing the implant mask; and
forming a first field effect transistor (FET) on the first portion of the first portion of the substrate, forming a second FET on the second portion of the substrate, and forming a third FET on the second portion of the first portion of the substrate, wherein the second FET has a higher radiation sensitivity than the first FET, wherein a radiation sensitivity of the third FET is higher than the radiation sensitivity of the first FET, and wherein the radiation sensitivity of the third FET is lower than the radiation sensitivity of the second FET.

13. A method for forming a semiconductor device, the method comprising:
forming an implant mask on a substrate, such that a first portion of the substrate is located under the implant mask, and a second portion of the substrate is exposed, and wherein the substrate comprises a bulk silicon substrate;
performing oxygen ion implantation of the substrate;
removing the implant mask;
annealing the substrate at a temperature of about 1300° C. in an ambient environment of argon and oxygen.
After annealing the substrate, forming a first field effect transistor (FET) on the first portion of the substrate, and forming a second FET on the second portion of the substrate, wherein the second FET has a higher radiation sensitivity than the first FET.

* * * * *